United States Patent [19]
Miremadi et al.

[11] Patent Number: 5,854,507
[45] Date of Patent: Dec. 29, 1998

[54] MULTIPLE CHIP ASSEMBLY

[75] Inventors: Jian Miremadi, Sunnyvale; Marc P. Schuyler, Mountain View, both of Calif.

[73] Assignee: Hewlett-Packard Company, Palo Alto, Calif.

[21] Appl. No.: 119,702

[22] Filed: Jul. 21, 1998

[51] Int. Cl.$^6$ .................................................. H01L 23/02
[52] U.S. Cl. ..................... 257/686; 257/685; 257/706; 257/778
[58] Field of Search ...................... 257/706, 707, 257/685, 686, 778; 438/107, 109, 108

[56] References Cited

U.S. PATENT DOCUMENTS

| | | | |
|---|---|---|---|
| 5,594,275 | 1/1997 | Kwon et al. | 257/685 |
| 5,715,144 | 2/1998 | Ameen et al. | 257/668 |
| 5,751,060 | 5/1998 | Laine et al. | 257/778 |
| 5,760,478 | 6/1998 | Bozso et al. | 257/685 |

Primary Examiner—Carl Whitehead, Jr.
Assistant Examiner—S.V. Clark
Attorney, Agent, or Firm—Marc P. Schuyler

[57] ABSTRACT

This disclosure provides a multiple chip assembly where multiple chips are stacked on top of one another using relatively low melting temperature solder balls. Preferably, the chips (either packages or flip chip attachment) are each mounted to a substrate which is larger in lateral surface area than the associated chip. Each substrate thus has a free area, not masked by the chip, which is utilized to mount a vertically-adjacent substrate. Within this free area, solder balls connect the substrates to provide for vertical logic bus propagation through the assembly and vertical heat dissipation. The solder balls are made to have a relatively low melting temperature, permitting interconnection between chip/substrate layers without affecting connection between chip and substrate or with an intervening carrier. At the same time, the layers are compressed together during such interconnection to bring a thermal transport layer in contact between the bottom of each substrate and the chip of an underlying layer, to facilitate lateral heat dissipation.

15 Claims, 3 Drawing Sheets

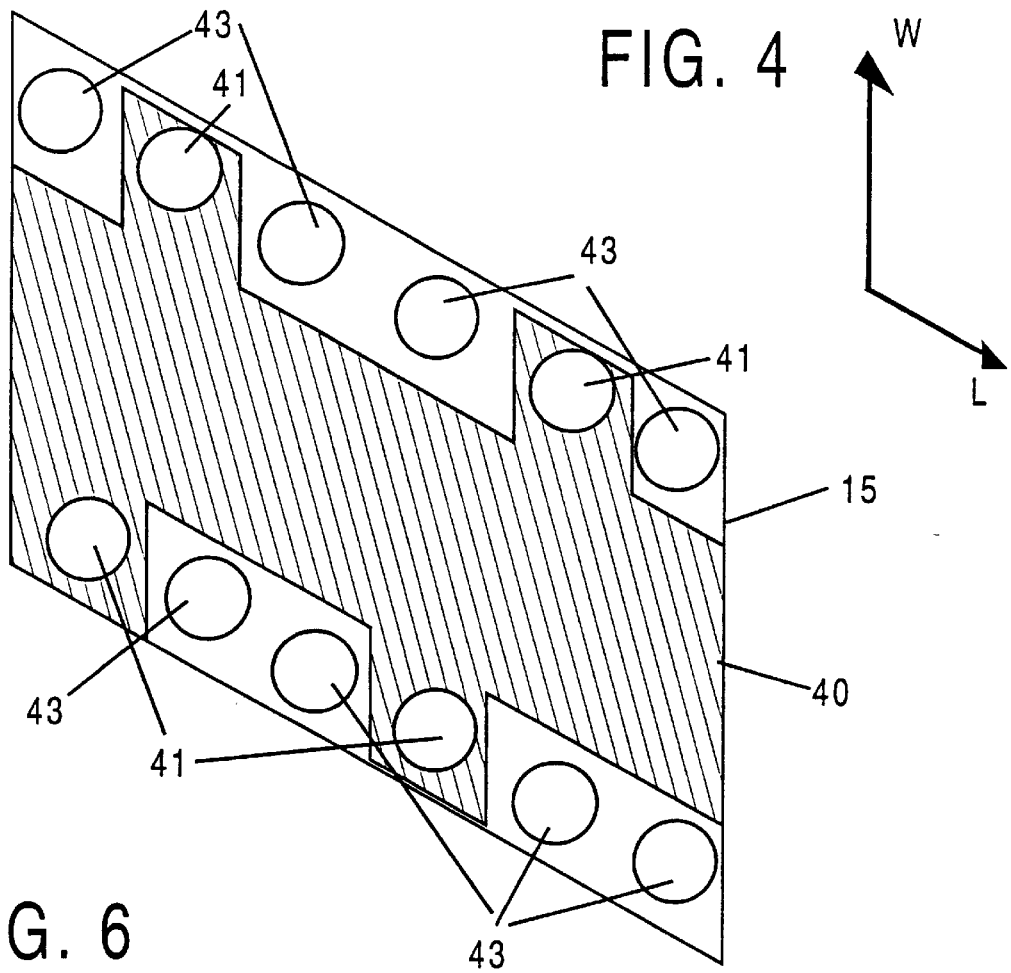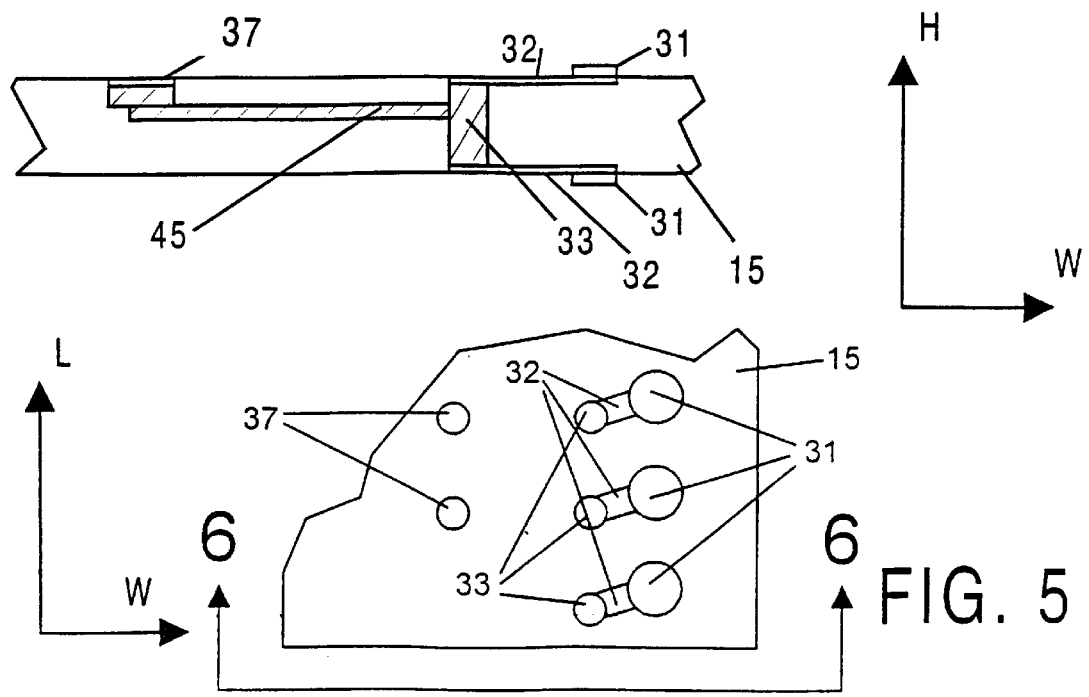

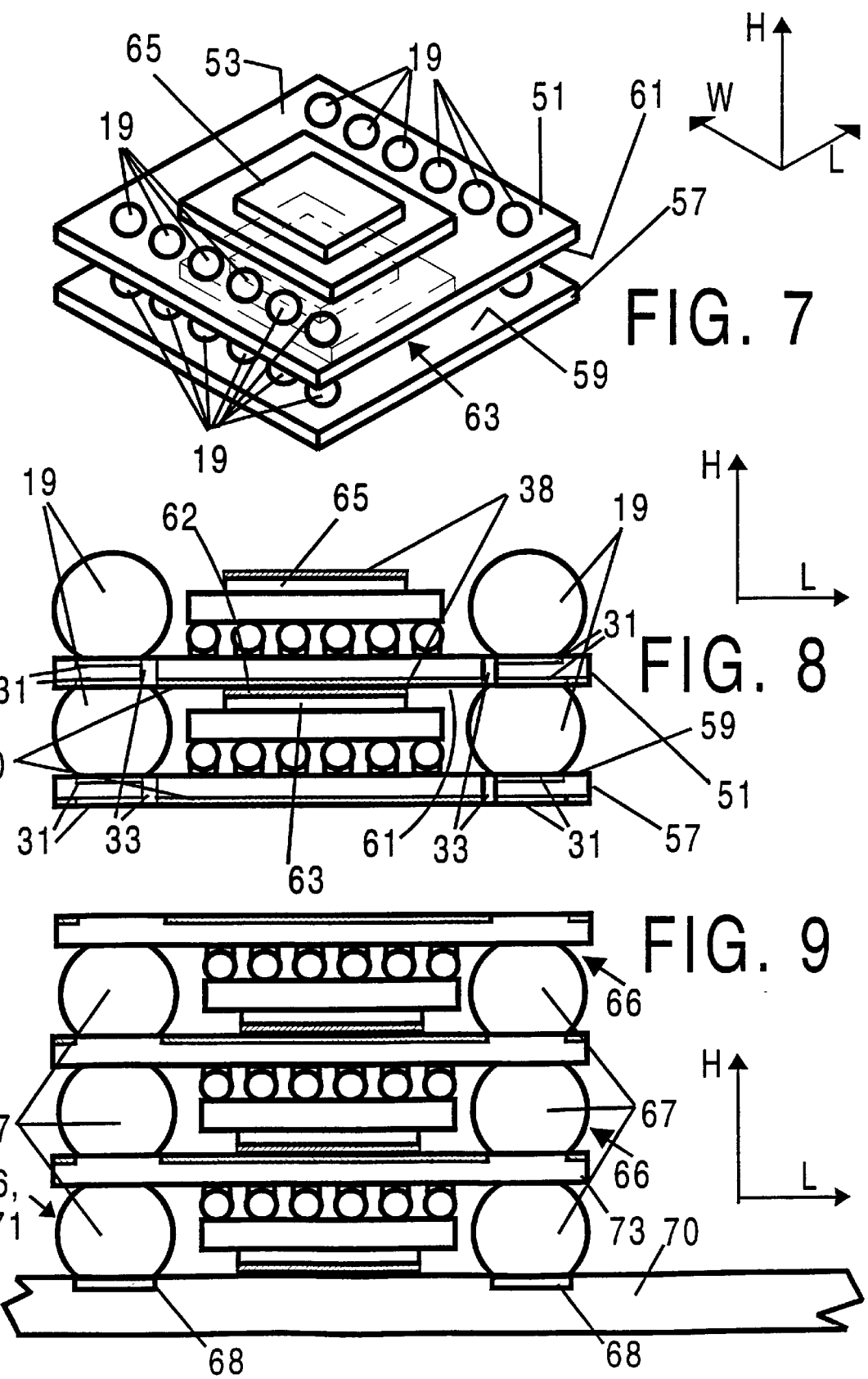

MULTIPLE CHIP ASSEMBLY

The present invention relates to integrated circuits and, in particular, it provides a three-dimensional multiple chip assembly.

As used herein, the term "integrated circuit" ("IC") shall mean any structure having a silicon chip, including but not limited to instances where a chip is mounted on a carrier, to thereby form a "package;" the term "IC" also encompasses attachment of a silicon chip only directly to a board.

BACKGROUND

Advances in semiconductor technology have facilitated the development of smaller and smaller integrated circuits over the past thirty years; presently, industry possesses adequate technology to fabricate computers, telephones, scanners and video cameras which can fit within a shirt pocket, and these devices tend to be more affordable than their larger predecessors. Much of these size reductions have been facilitated by design of smaller and smaller silicon chips, typically based on reductions of minimum silicon (electrical trace) geometry alone.

Conventionally, the silicon chips are mounted to a carrier, the use of which facilitates testing of the chip prior to mounting to a printed circuit board ("PCB"); use of a carrier also enables redistribution of the pitch of input and output connections to be more compatible with PCB technology, and replacement of defective chips following mounting. Typically, the carrier is larger than the chip itself and together, the chip and carrier form a "package" which is the commonly recognized IC seen in retail stores. An IC can sometimes also take the form of a direct chip attach (DCA), where the a chip alone is directly mounted to a PCB (e.g., so-called "flip chip technology"). Each of these arrangements have certain advantages, although to date, DCA is not generally used for expensive equipment, but rather is used for inexpensive products that can simply be discarded if inoperable (DCA has not to date yielded a process suitable for easy chip replacement). Whichever form of IC mounting is used, the ICs are generally individually mounted to a PCB, which can mount many chips and have a number of off-board connections for connecting other PCBs.

As the size of the ICs continues to decrease, however, it is increasingly difficult to obtain further reductions in product size by relying solely upon reductions in minimum silicon geometry. To achieve further product size reductions, therefore, some recent design efforts have been devoted toward space savings achieved by stacking ICs vertically on top of one another, especially in connection with memory technology. These design efforts have generally focused on providing ever increasing amounts of integrated circuits into a smaller and smaller space, to thereby enable design of even smaller computers, telephones, scanners, video cameras, etcetera.

The design efforts devoted toward stacking ICs typically employ a special carrier which has wire leads which emanate laterally from the package for mounting to a peripheral frame. The peripheral frame provides structural support for the packages, and also carries an electrical bus for connection to the individual wire leads of each package. The vertically-stacked packages are then laminated or made moisture resistant, and are eventually mounted as a single unit to the PCB.

For the space savings achieved, however, the recent design efforts have required a relatively labor intensive and costly assembly between separate packages, typically using hardwired assembly between separate packages. In addition, because the chips generate heat during operation, one design consideration is the presence of structure which permits heat to escape from within the stacked packages, for dissipation outside the frame. Such structure generally further adds to the cost and complexity of the assembly.

There exists a definite need for a three-dimensional chip assembly, useable for both memory chips and other integrated circuits, which provides for easy and efficient assembly and electrical connection of vertically-stacked chips. Preferably, such an assembly should be very low-cost and be compatible with existing interconnect and PCB technology. Further still, such an assembly should include an efficient method of heat dissipation. The present invention solves these needs and provides further, related advantages.

SUMMARY

The present invention provides a three-dimensional chip assembly and related method that solves the aforementioned needs. In particular, the present invention relies upon a substrate that, contrary to conventional wisdom, is deliberately made larger in lateral dimension than chip size. By using relatively large scale solder bumps in a free area of the substrate (laterally adjacent to the chip or package), the solder bumps provide electrical connection to another substrate in a manner that multiple substrates can be stacked in parallel. By employing conventional PCB technology to provide connections through the substrates and to dissipate heat laterally across the substrates, the present invention eliminates the need for complicated or labor-intensive mounting procedures, such as for special frames and the like. The present invention provides a low-cost method of making vertically-stacked multiple chip assemblies, and it facilitates the trend toward smaller and less expensive consumer products.

One form of the present invention provides an assembly having at least two ICs that are stacked above one another. The bottom IC (which may be a chip with or without a supporting carrier) is smaller in surface area than a bottom substrate, such that a "free area" of the bottom substrate is defined which is not masked following attachment of the IC. In this "free area," solder bumps are deposited to have sufficient height so as to mount another, top substrate above the IC. Multiple ICs can be all configured and supported in this manner, such that they may be stacked on top of one another.

More particularly, solder balls are used to mount substrates directly in parallel, sandwiching chips and any intervening carriers between the substrates. Each substrate has on its bottom side a thermally conductive layer, which directly contacts the underlying chip, to allow for peripheral heat dissipation during chip operation. By permitting some deformation of the solder balls during assembly, adjacent IC layers may be compressed together to bring each chip into contact with the heat dissipating layer of the adjacent IC layer.

The invention may be better understood by referring to the following detailed description, which should be read in conjunction with the accompanying drawings. The detailed description of a particular preferred embodiment, set out below to enable one to build and use one particular implementation of the invention, is not intended to limit the enumerated claims, but to serve as a particular example thereof.

BRIEF DESCRIPTION OF THE DRAWINGS

as seen in FIG. 3, the IC, consisting of a chip and carrier, may also be mounted using solder balls of relatively small pitch.

FIG. 4 is a perspective view of a bottom side of a substrate of FIG. 3, namely, which shows a thermal transport layer for dissipating heat laterally away from a chip that will contact the bottom side; solder balls are illustrated upon to bonding pads on the bottom side, with some solder balls (connected to the thermal transport layer) used for vertical heat transfer, and other solder balls (not connected to the thermal transport layer) used for vertical propagation of a logic bus throughout the assembly.

FIG. 5 is a top view of a portion of a substrate, which illustrates positioning of bonding pads with respect to through-hole connections.

FIG. 6 is a side view of a portion of the substrate of FIG. 5, taken along lines 6—6 of FIG. 5, and illustrates a routing of electrical connections within multiple layers of the substrate or PCB.

FIG. 7 is a perspective view of two layers of an assembly of FIG. 1, namely, a single layer seen in FIG. 2 with another, identical layer which has been mounted vertically above the single layer; an IC seen in FIG. 2 is now illustrated in phantom, as it lies between the two layers of FIG. 7.

FIG. 8 is a side view of a multiple chip assembly of FIG. 7, and indicates preferred use of solder balls to perform both interconnection of an IC to a corresponding substrate, as well as interconnection between adjacent substrates; the solder balls which connect substrates are seen as preferably mounting substrates flush against adjacent chips for peripheral thermal dissipation.

FIG. 9 is a side view of a multiple chip assembly of FIG. 1, including three layers which have been connected together, inverted, and mounted upon a printed circuit board ("PCB").

DETAILED DESCRIPTION

The invention summarized above and defined by the enumerated claims may be better understood by referring to the following detailed description, which should be read in conjunction with the accompanying drawings. This detailed description of a particular preferred embodiment, set out below to enable one to build and use one particular implementation of the invention, is not intended to limit the enumerated claims, but to serve as a particular example thereof. The particular example set out below is the preferred specific implementation of a multiple chip assembly, namely, one which uses solder balls to mount substrates above each other, notwithstanding the presence of chips or ICs there between. The invention, however, may also be applied to other types of systems as well.

I. Introduction To The Principal Parts.

Figure 1:
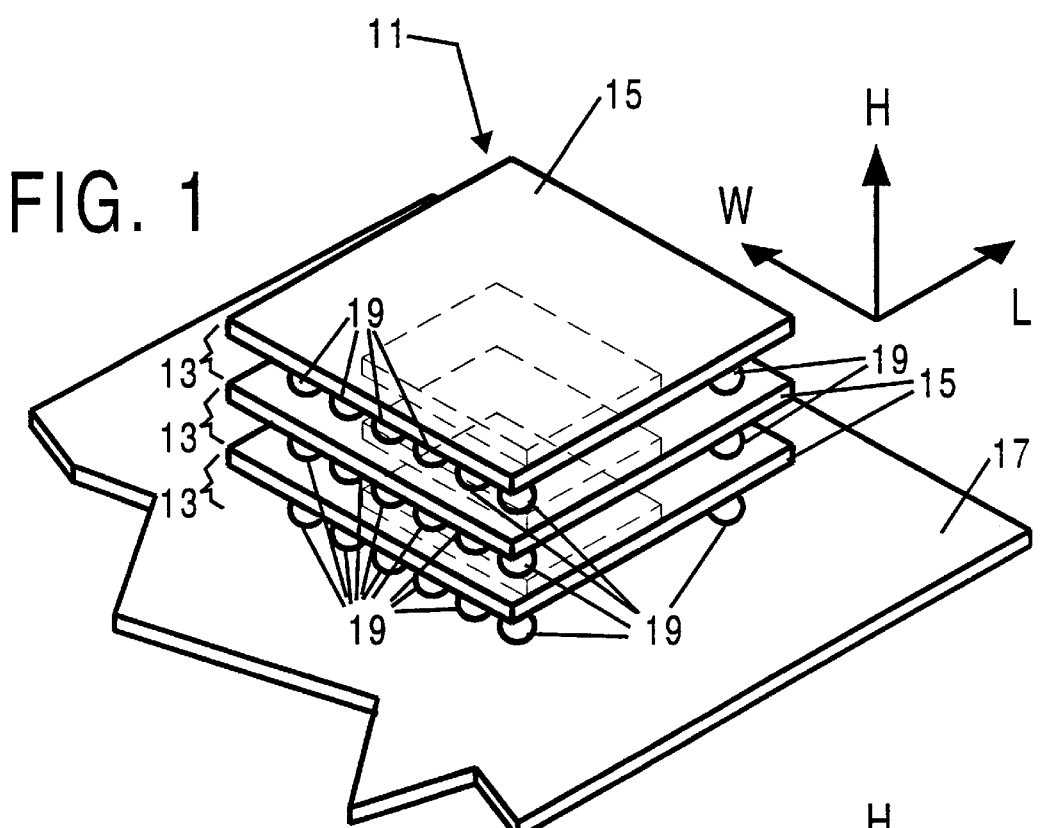
FIG. 1 is a perspective view of a multiple chip assembly having three IC layers; the assembly is seen as flipped and mounted to a printed circuit board ("PCB").

In accordance with the present invention and as seen in FIG. 1, the preferred embodiment is a three-dimensional assembly 11 that features multiple integrated circuit ("IC") layers 13 which are vertically-stacked above one another. Each layer includes both an IC (seen in phantom in FIG. 1) and a supporting substrate 15, oriented such that the IC and supporting substrate face downward toward a printed circuit board ("PCB") 17. Each IC performs logic or storage functions in response to electrical signals, and these functions may be the same or different across multiple IC layers 13 of the assembly; that is to say, while the preferred embodiment is a memory module, with each layer having similar dynamic random access memory ("DRAM") ICs, different types of ICs can also be used (e.g., one layer having a microprocessor, a second layer having memory). FIG. 1 shows three IC layers which are all structurally and electrically connected together by a number of solder bumps 19, which also connect the assembly to the PCB 17. Although FIG. 1 shows only three IC layers, it should be understood that any number of IC layers can be stacked over the PCB. Also, the downward mounting of the IC layers 13 is one possible orientation, and the layers may also be oriented to face upward. The mounting of the assembly 11 with individual IC layer substrates 15 parallel to the PCB 19 is also not the only configuration contemplated by the present invention, which could feature ICs stacked along any direction, e.g., with substrates mounted to the PCB along one of their lateral edges.

Although not seen in FIG. 1, the PCB 17 mounts other circuits which are not part of the multiple chip assembly, at different locations along the board's lateral dimensions, "L" (for length) and "W" (for width). In accordance with the present invention, however, and as seen in FIG. 1, the ICs of the three-dimensional assembly 11 are stacked vertically, i.e., such that they are adjacent and occupy all three dimensions "H," "L" and "W," to achieve space savings. In addition, each IC includes a mechanism for permitting lateral heat dissipation in between layers.

Figure 2:
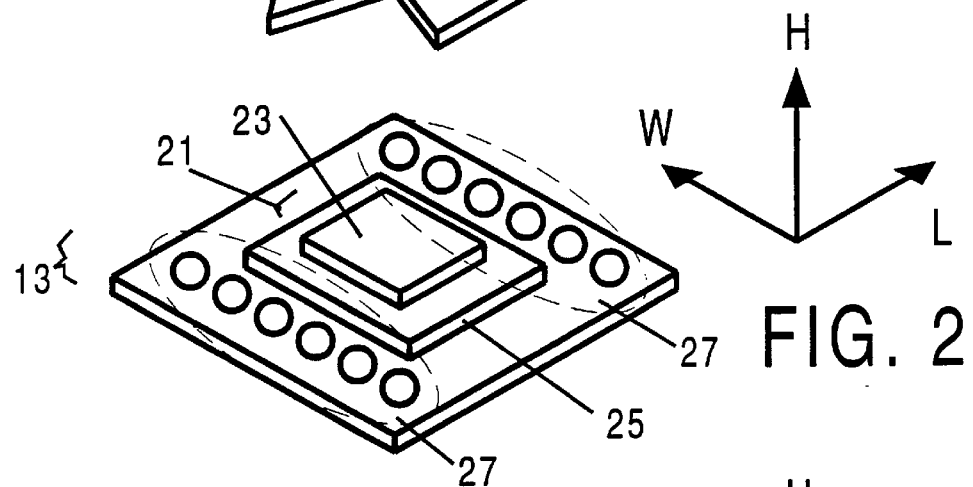
FIG. 2 is a perspective view of a single IC layer of the assembly of FIG. 1; the layer includes an IC, consisting of a chip and carrier, which is mounted atop a supporting substrate; solder balls are seen as positioned in a free area of the substrate not masked by the IC.

A single IC layer 13 is seen in FIG. 2 with an IC 21 facing upward; the IC is seen to include both a silicon chip 23 and a carrier 25 which mounts the chip, in a preferred one-to-one (chip-to-substrate) configuration. Notably, one-to-one correspondence between the chips and substrates is not required, and alternative configurations can feature multiple ICs on each substrate. ICs can also be configured in a flip chip configuration if desired, e.g., such that a chip is directly attached to a supporting substrate without a carrier. The mounting of the IC 21 upon each substrate 15 defines a free area 27 of the substrate which is not masked by any IC; in other words, contrary to tendencies toward chip scale packages prevalent in second level interconnection, the preferred embodiment deliberately relies upon mismatched area between a chip or package and supporting substrate for the purpose of providing electrical connection and thermal dissipation between adjacent IC layers.

Figure 3:
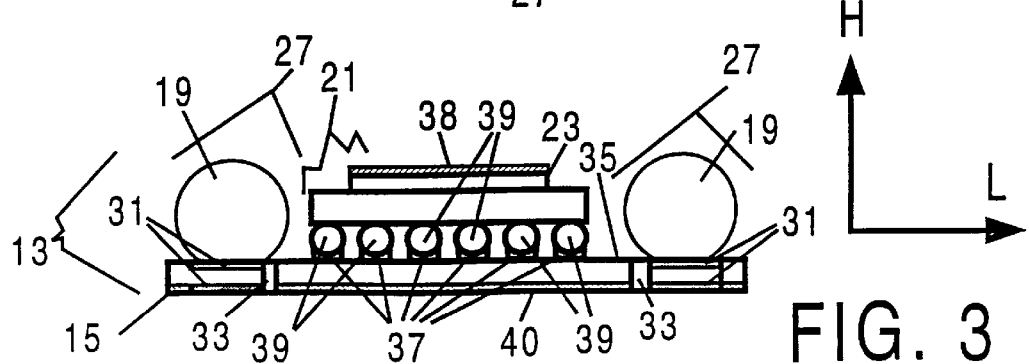
FIG. 3 is a side view of a single layer of FIG. 2, which shows optional through-hole connectors for conducting heat vertically rough the assembly.

To this end, as seen in FIG. 3, each substrate 15 is substantially flat, and solder bumps 19 are deposited upon prearranged bonding pads 31 within a free area 27 to provide both electrical interconnection between layers as well as vertical thermal transport for heat dissipation. Basically stated, there are two types of solder bumps between layers, including bumps which vertically route a logic bus through the assembly, and bumps which vertically connect lateral thermal layers of all IC layers. The arrangement of the various bonding pads within the free area can be generally defined by lateral positioning of through-hole connections 33 which correspond to the bonding pads. In most applications, for example, memory technology applications, the dimensions of all substrates and positioning of through-hole connections are preferably made constant across all IC layers. In this manner, the assembly provides for roughly linear vertical propagation of a logic bus along the height dimension "H." Each substrate also includes vias (not seen in FIG. 3), either on a top planar surface 35 of the substrate or within the substrate's thickness, which connect the IC 21 to other bonding pads 37 for directly mounting the IC to the particular substrate.

Lateral heat dissipation occurs through two layers 38 and 40 indicated in FIG. 3. A first layer, 38, is formed from a heat conductor, such as an adhesive conductive tape which is layered on top of the IC 21 (and more particularly the chip 23) after connection of the IC to the substrate (i.e., after second level interconnection). A second layer 40 is found on the underside of each substrate, and is deposited for the purpose of continued lateral heat dissipation to lateral edges of each substrate and for coupling to solder bumps used for vertical heat dissipation. The second layer is formed of Organic-Coated Copper ("OCC") and preferably spans a substantial area of the substrate, in a manner that will be explained below. When IC layers 13 are stacked upon one another, it is intended that the second layer 40 of one IC layer will directly abut the first layer of a second IC layer, and so on, such that they together form a thermal transport mechanism for conducting heat from the chip 23 laterally away from the chip, in a direction perpendicular to the height dimension "H". The second layer 40 of each IC layer 13 is optionally coupled to certain (but not all) solder bumps 19, which provide for vertical heat transport through the assembly.

The multiple chip assembly 11 is fabricated through a series of tasks that preferably first constructs each IC layer, then stacks the layers and compresses them together to form the assembly, and then mounts the assembly upon the PCB; the last two steps may also be combined. FIGS. 2–6 show a single layer of the assembly, while FIGS. 7–8 show a stacking of two layers. FIG. 9 illustrates a stacking of three IC layers, in which the IC layers have been inverted to face downward toward a PCB.

II. IC to Substrate Attachment and Substrate Configuration.

Attachment of the IC to the substrate is performed using conventional methods of attachment of a chip to a PCB. Consequently, use of flip chip attachment or a package attachment might be suitable, depending upon the particular application desired. Since the preferred assembly features use of identical DRAM chips within each IC layer 13, it is presently preferred to use a package attachment process for such chips.

As is well-recognized by persons skilled in electronic assembly, the choice of attachment process will many times depend upon the type of package utilized. For example, one package gaining interest in the industry utilizes a conductive tape which is first attached to a chip, and then attached to a substrate beneath the chip; the tape itself forms the carrier in this type of arrangement and has through-tape vias that permit one side of the tape to be electrically connected to the chip and a second side of the tape to be electrically connected to the substrate. Another process, illustrated in FIGS. 3 and 6–8, utilizes relatively small size lead solder bumps 39 which electrically connect the IC 21 to its corresponding substrate 15. It is well-recognized in the art that the type of process utilized is a matter of design choice; irrespective of the particular process used, the term "first level interconnection" generally refers to electrical coupling of a chip 23 to a carrier 25 (e.g., in forming a package, seen in FIG. 2), and second level interconnection refers to connection of a carrier (and thus the package) to a substrate 15. Preferably, the first and second level interconnection methodologies use a relatively high temperature solder joint (i.e., using a temperature that is somewhat greater than the melting point of the solder bumps used between different IC layers).

In the preferred embodiment where DRAM chips are used, a solder bump formation process is used to attach a package to each substrate 15, that is, to perform second level interconnection. There are many types of solder bump formation processes; typically, the processes rely upon a complex series of deposition procedures which apply solder over numerous, discrete areas, and then, perform simultaneous attachment of all solder bumps to achieve electrical connection. The preferred interconnection process for connecting ICs to each substrate utilizes pre-fabricated solder balls, bonding pads and through-layer vias. Preferably also, a solder is used consisting of tin and lead and having a melting temperature on the order of three-hundred degrees Celsius. These materials are chosen to impart a relatively higher melting temperature than bonding pads used for interconnection between substrates (described below) such that, during connection between multiple IC layers, the electrical and structural connection between chip and substrate will not be affected. It is also generally desirable to have an under fill between the chip and the package substrate, thereby encapsulating solder balls in order to reduce damage from thermal cycling in normal operation of the chips, although an under fill is not explicitly illustrated in the accompanying figures. As can be seen from the figures, each substrate 15 is a miniature multilayer circuit board having electrical connections within each one of several layers.

FIG. 4 presents a perspective view of the bottom of one substrate, while FIG. 5 presents a cross-section of a part of one substrate.

As indicated by FIG. 4, a substrate 15 has on its bottom surface bonding pads that receive solder balls 41 or 43 for second level interconnection (that is, for connection vertically to other ICs). Notably, two types of connections are indicated by FIG. 4, including solder ball connections 41 used for vertical thermal transport (between layers and to the PCB) and solder balls connections 43 for vertical logic bus propagation. To this effect, the second thermal transport layer 40 on the bottom of each substrate is patterned of organic-coated copper ("OCC") during substrate manufacture to preferably connect to every third or fourth solder ball, as indicated in FIG. 4. This thermal transport layer, as has previously been described, is placed in direct contact with a chip of an underlying IC layer (or more accurately, layers 38 and 40 on the top of the IC and the bottom of a substrate are combined to form a thermal transport layer that directly contacts an IC or package), and is used to dissipate heat from the chip peripherally, toward the lateral edges of the assembly. It should be understood that FIG. 4 illustrates a relatively small number of solder ball connections, and a hypothetical thermal transport pattern, and that one skilled in the art should be able to readily select an appropriate pattern depending upon the desired application.

Arrangement of bonding pads upon the substrate is further illustrated in FIG. 5, which shows a cut-away top view of part of a substrate. As seen in FIG. 5, a first group of bonding pads 31 (for solder ball connections between substrates) are positioned adjacent to hole connections 33. Surface traces 32 couple corresponding bonding pads 31 and through hole connections 33, so as to prevent wicking of solder by the through-hole connection. Also seen in FIG. 5 are a second group of bonding pads 37 used to mount one or more ICs to the substrate 15. In-substrate vias (not seen in FIG. 5), couple this second group of bonding pads 37 to corresponding through hole connections. Importantly, some of the first group of bonding pads 31 are used for vertical thermal transport, and therefore, have no corresponding IC connection (e.g., bonding pad 37).

This relationship is further illustrated by FIG. 6, which is a cross section of part of the substrate seen in FIG. 5, taken along lines 6—6 of FIG. 5. More particularly, as seen in FIG. 6, bonding pads 31 for inter-substrate connection are located on top and bottom sides of the substrate 15, slightly offset from a corresponding through-hole connection 33. A surface trace 32 on each side of the substrate connects the two together. As seen at the left side of FIG. 6, an IC bonding pad 37 is also coupled to the through-hole connection 33 by an inner trace 45 which is in a middle layer of the substrate. All of the coupling materials are formed of copper, with a non-oxidizing material such as an organic coating capping layers which are exposed to air.

III. Interconnection Between Adjacent Layers And To PCB.

Interconnection between layers will be explained with reference to FIGS. 7–9. While FIGS. 7 and 8 in particular show only two IC layers, it should be understood that the preferred attachment process between IC layers and between, a between an IC layer or finished assembly and the PCB, are identical; consequently, attachment of any two IC layers could, in the context of the present invention, be taken to either be IC layers (designated by reference numeral 13 in FIGS. 1–3), or a single substrate 15 of a "bottom" IC layer and the PCB 17. However, it will be assumed for purposes of the discussion below that two substrates that are to be connected represent two IC layer substrates already having chips mounted upon them.

FIG. 7 shows a first substrate 51 and a second substrate 57 which are connected together by solder balls 19. In accordance with the principles described above for forming each IC layer, solder balls are mounted on substrates 51 and 57 laterally adjacent to an IC 63 or 65. In forming connection between layers, the solder balls 19 are preferably pre-deposited on the top side 59 of each substrate. The substrates, solder balls and associated pads are aligned, and then are heated to a temperature sufficient to melt the solder balls and bring the substrates (and associated heat conducting layers 40) into direct contact with underlying ICs.

This relationship is illustrated by FIG. 8, which shows that the bottom side 61 of the first substrate has been brought into direct contact with a top side 62 of the IC 63 of the underlying layer. While the solder balls are originally spherical (as indicated, for example, by FIG. 3), heating of the assembly and tendency of the solder balls 19 to spread to adhere to associated bonding pads 31 causes the solder balls to become molten and deform, to draw the substrates together to sandwich ICs between them. The solder balls are heated to somewhat over their melting temperature, and it is expected that with proper solder ball 19 size and bonding pad 31 size and geometry, surface tension of the solder should provide sufficient force to bring substrates into contact with the ICs of adjacent layers. A clamping mechanism could potentially be used during the heating procedure to ensure elimination of any space between an IC and the substrate from an adjacent layer, although it is expected that such should not be necessary and would increase production cost. It should also be noted that the solder balls are designed to have mass that falls within a narrow tolerance, i.e., such that there is enough solder to wet the bonding pads, but not so much solder as to create electrical shorts with other, adjacent bonding pads. Preferably, eutectic tin-bismuth solder balls 19 are used for the solder connection, and the bonding pads preferably are formed of OCC, so that when the solder balls 19 melt, they provide a suitable bond to these pads. More particularly, the solder balls are formed of a 58% tin, 42% bismuth alloy, which has a melting temperature of approximately 138 degrees Celsius. For improving solder joint strength and reliability, this 58/42 mixture can be supplemented by an approximately zero-to-two percent by weight quantity of silver.

To mount IC layers 13 together, as seen in FIGS. 2, 7 and 8, a first substrate 51 is aligned with a second substrate 57 to place the solder balls 19 directly in contact with the bonding pads and a bottom side 61 of the second substrate 57. The solder balls 19, being formed of a relatively low-temperature metal, are softened without disturbing the integrity of the connections which mount an IC to either substrate 51 or 57. Preferably, all IC layers of the assembly seen in FIG. 1 are coupled together simultaneously and, so, solder balls would have already been mounted to the top of each (e.g., the top side 53 of each) substrate, with all substrates in the assembly being aligned and mounted to each other at the same time. At the same time, the layers are compressed together while the solder balls are softened to bring a first thermal transport layer 38 of each IC into direct contact with a second thermal transport layer 40 on the bottom of each IC, as illustrated in FIG. 8. As a result, heat is dissipated laterally, along the dimensions "W" and "L" as identified in the different perspectives presented in FIGS. 1–9.

Attachment and mounting together of the multiple IC layers upon a PCB is best seen with reference to FIG. 9. In particular, the assembly is seen to consist of three IC layers 66 which have been stacked on top of each other using solder balls 67. A set of bonding pads 68, formed of OCC, are positioned on the PCB 70 so as to align with bonding pads and associated solder balls of a top layer 71 of the assembly, which has been inverted with respect to the PCB. Via a heating process, the solder balls are made to melt, with the assembly properly oriented on top of the PCB, such that strong and reliable connections are formed between the assembly and the PCB. Notably, since the substrate 73 of a bottom IC layer is made of substantially the same material as the PCB 70, there will be insignificant thermal mismatch between the assembly 11 and the PCB, and an under fill need not be added to support mounting of the assembly.

The preferred multiple chip assembly 11 just described is not necessarily intended for application to all potential three-dimensional combinations of ICs. Notably, while the thicknesses of the heat transport layers (38 and 40, seen in FIG. 3) can be varied in accordance with different desired applications, there may be some applications which require additional and substantial cooling arrangements. For example, it is well understood in the art that some chips generate very large amounts of heat, sometimes requiring dedicated fans and other cooling arrangements, and use of lateral heat transport through heat transport layers, as described herein, may provide insufficient for some chips in some applications.

Various modifications of what has been described will readily occur to those of ordinary skill in the art without departing from the principles of the present invention. For example, one could stack ICs in a different configuration than has been illustrated in connection with the accompanying figures. Also, one could use the IC layer arrangement just described to mount different types of chips either on the same IC layer or across multiple layers, e.g., a microprocessor chip and a memory chip could both be mounted within the assembly. The particular use of through-hole connections for running a bus vertically through all substrates (to service all chips in the assembly) or vias within substrates are not the only possible implementations for electrically connecting together the multiple layers according to the present invention. Also, one could mount IC layers together without providing a separation between ICs and the substrates of adjacent layers.

Having thus described several exemplary embodiments of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the foregoing discussion is intended to be illustrative only; the invention is limited and defined only by the following claims and equivalents thereto.

We claim:

1. A multiple chip assembly, comprising:
   a first integrated circuit mounted upon a first substrate;
   a second integrated circuit mounted upon a second substrate, the second integrated circuit having a height associated with it, the second integrated circuit also being overlapped by the second substrate in at least one of width and length dimensions, such that the second substrate presents a free area not masked by the second integrated circuit; and
   solder bumps which provide electrical interconnection between the first and second substrates, the solder bumps being at least as tall as the height of the second integrated circuit to thereby electrically mount the first substrate in a stacked relation above the second integrated circuit;
   a thermal transport layer in between and in contact with each of the second integrated circuit and the first substrate;
   wherein
      the second substrate includes (on a side of the second substrate which mounts the second integrated circuit), in the free area, electrical terminations for electrical interconnection to the first substrate,
      the first substrate includes corresponding electrical terminations for electrical interconnection to the second substrate, and
      the solder bumps connect the electrical terminations of the second substrate with the corresponding electrical terminations of the first substrate.

2. A multiple chip assembly according to claim 1, wherein the second integrated circuit includes both a chip and a carrier, the chip mounted to the carrier by a first level interconnection, and the carrier mounted to the second substrate by a second level interconnection.

3. A multiple chip assembly according to claim 2, wherein both the second level interconnection and the electrical interconnection between the first and second substrates are made using solder bumps.

4. A multiple chip assembly according to claim 1, wherein electrical terminations for electrical interconnection to the second substrate are mounted on a side of the first substrate opposite the first integrated circuit.

5. A multiple chip assembly according to claim 1, wherein each substrate mounts a single integrated circuit only, such that there is a one-to-one correspondence between each chip and each substrate in said assembly.

6. A multiple chip assembly according to claim 1, wherein the thermal transport layer includes both a first transport layer mounted on a top of the second chip, and a second thermal transport layer mounted on a bottom of the first substrate.

7. A multiple chip assembly according to claim 1, further comprising:
   a second level interconnection which connects the second chip to the second substrate; and
   a substrate interconnection which connects the first substrate to the second substrate;
   wherein a melting temperature associated with the second level interconnection is substantially less than a melting temperature associated with the first level interconnection.

8. A multiple chip assembly according to claim 7 wherein the second level interconnection has an associated melting temperature that is greater than two hundred and fifty degrees Celsius and the substrate interconnection has an associated melting temperature that is less than one hundred and fifty degrees Celsius.

9. An improvement in a stacked multiple chip assembly, the multiple chip assembly including at least first and second integrated circuit layers in stacked relation, each layer including at least one chip and a substrate, all substrates being electrically connected together, comprising:
   for the second layer, using a chip and substrate combination with non-matched area, such that the substrate overlaps the chip in at least one lateral dimension, to define a free area in the substrate which is not masked by the chip;
   electrical terminations in the free area arranged to provide electrical interconnection between the first and second layers;
   solder bumps providing the electrical interconnection, the solder bumps having an associated height dimension sufficient to directly mount the substrate of the first layer upon the substrate of the second layer, also above each chip mounted upon the second layer; and
   a thermal transport layer directly in contact with a chip of the second layer and a bottom of the substrate of the first layer.

10. An improvement according to claim 9, further comprising:
    a carrier which intervenes between at least one chip and a corresponding substrate that mounts the chip;
    a first level interconnection which electrically connects and mounts the at least one chip to the corresponding carrier; and
    a second level interconnection which electrically connects and mounts the corresponding carrier to the second substrate.

11. An improvement according to claim 10, further comprising providing the electrical interconnection between layers by:
    forming the second level interconnection to have solder bumps which melt at a lower temperature than melting point of the first level interconnection; and
    placing the solder bumps in contact with electrical terminations and heating the solder balls and electrical terminations to a temperature which melts the solder bumps but does not fully melt the first level interconnection.

12. An improvement according to claim 11, further comprising:
    forming the solder bumps to initially have a height greater than any chip between the first and second layers after electrical connection, to thereby initially place the first substrate in spaced relation above any intervening chips; and
    subsequently heating the solder bumps to a temperature which at least partially melts them and permits compression of two layers toward each other to eliminate the spaced relation while the solder bumps are heated.

13. A method of stacking multiple chips, using first and second integrated circuits and associated first and second substrates, the second substrate selected to be larger in at least one lateral dimension than the second integrated circuit, such that the relative dimensions of the second integrated circuit and second substrate are not matched, the first substrate having a bottom side with a thermal transport layer that substantially spans the bottom side, comprising:

forming a first set of substrate interconnection pads on top of the second substrate within a free area not masked by the second integrated circuit, to provide for electrical interconnection between the first substrate and the second substrate;

forming a second set of substrate interconnection pads on bottom of the first substrate to provide electrical interconnection between the first substrate and the second substrate, the second set of substrate interconnection pads aligned for electrical interconnection with the first set of substrate interconnection pads when the substrates are placed in proximity to one another;

depositing solder bumps on at least one of the first set and second set of substrate interconnection pads;

mounting the first integrated circuit on top of the first substrate and mounting the second integrated circuit on top of the second substrate;

mounting the first substrate on top of the second substrate and above the second integrated circuit, with the solder bumps providing electrical interconnection between substrates, with the second integrated circuit there between; and heating the first and second substrates and solder bumps, and removing space between the first substrate and the second integrated circuit, to bring the thermal transport layer into contact with the second integrated circuit.

14. A method according to claim 13, further comprising simultaneously stacking at least three chips and associated substrates, using solder bumps to electrically connect substrates to one another, by:

first mounting chips on each substrate; and heating together the chips and the substrates to a temperature sufficient to melt the solder bumps and bring the chips and substrates together, such that at least portion of an underside of one substrate comes into direct contact with at least one chip of another substrate.

15. A method according to claim 13, further comprising using heat and solder surface tension to draw the first substrate and the second integrated circuit together, to remove space between the first substrate and the second integrated circuit.

* * * * *